(12) United States Patent
Aizpuru et al.

(10) Patent No.: US 7,371,652 B2
(45) Date of Patent: May 13, 2008

(54) ALIGNMENT USING FIDUCIAL FEATURES

(75) Inventors: Jose Joaquin Aizpuru, Murphy, TX (US); Danny Robert Schoening, Plano, TX (US)

(73) Assignee: Finisar Corporation, Sunnyvale, CA (US)

( * ) Notice: Subject to any disclaimer, the term of this patent is extended or adjusted under 35 U.S.C. 154(b) by 240 days.

(21) Appl. No.: 11/158,682

(22) Filed: Jun. 22, 2005

(65) Prior Publication Data

US 2006/0289975 A1    Dec. 28, 2006

(51) Int. Cl.
*H01L 21/00* (2006.01)

(52) U.S. Cl. ............ 438/401; 438/462; 438/116; 438/64; 438/69

(58) Field of Classification Search .......... 438/15, 438/22–47, 51, 55, 64, 69, 106, 111, 112, 438/116, 123–127, 400, 401, 460, 462, FOR. 366, 438/FOR. 367, FOR. 377, FOR. 380; 257/13, 257/79–103, 118, 666–699, 918, 979, E33.001–E33.077, 257/E25.028, E25.032, E23.031–E23.059, 257/E23.179, E51.018–E51.022

See application file for complete search history.

(56) References Cited

U.S. PATENT DOCUMENTS

| 5,337,398 | A  | * | 8/1994  | Benzoni et al. | 385/90  |
| 5,821,532 | A  | * | 10/1998 | Beaman et al.  | 250/239 |
| 6,728,449 | B2 | * | 4/2004  | Trott          | 385/49  |

* cited by examiner

*Primary Examiner*—Jasmine Clark
(74) *Attorney, Agent, or Firm*—Workman Nydegger (57) ABSTRACT

The present invention relates to positioning components of an assembly using fiducial features. A first fiducial feature on a first piece of the assembly can be located. A first component can be positioned on the first piece of the assembly based on the location of the first fiducial feature. A second fiducial feature on a second piece of the assembly can be located. The second component can be positioned relative to the second piece of the assembly based on the location of the second fiducial feature. The first piece can be positioned relative to the second piece based on the locations of the first and second fiducial features. The assembly can be an optical device. The first component can be an active optical device, the second component can be a lens, the first piece can be a package, and the second piece can be a lid.

8 Claims, 5 Drawing Sheets

ALIGNMENT USING FIDUCIAL FEATURES

BACKGROUND OF THE INVENTION

1. The Field of the Invention

The invention relates generally to alignment of components and subcomponents of an optical assembly.

2. The Relevant Technology

Problems are often encountered when positioning components and sub-components of optical assemblies. One type of optical assembly is an optical package. Optical packages and other optical assemblies can include components such as an active optical device attached to a leadframe. Die attach can provide the mechanical support between the active optical device and the leadframe. Die attach (also known as die mount or die bond) is the process of attaching a silicon component to the die pad or die cavity of the support structure (e.g., the leadframe) of the semiconductor package. There are two common die attach processes, i.e. adhesive die attach and eutectic die attach. Both of these processes use special die attach equipment and die attach tools to mount the die.

A mold compound can protect the optical device mechanically and environmentally from the outside environment. Transfer molding, injection molding, or other molding processes can be used to at least partially encapsulate many packages and are often used to encapsulate leadframe based packages. The leadframe can include, or be coupled to, conductors (e.g. lead fingers for a leadframe) or conductive traces as well as terminal contacts (e.g. metal leads or solder balls) for making electrical connection from outside of the package.

Placement machines can be programmed with component positional information derived from CAD data generated during the design and manufacture of the assembly. The edges of a leadframe are typically referenced for positioning components of an assembly on a leadframe. However, leadframes can change shape from part to part, and even the most accurate and precise mechanical referencing can still result in positional variation between the programmed position of a component and its actual position on a leadframe.

In addition, different components requiring accurate placement and/or optical alignment can be located on different parts of the optical package, which can be later assembled into the optical package or optical assemblies thereby compounding overall tolerances for alignment. For example, an active optical device (e.g. a laser, light emitting diode or a photodiode receiver) located upon a substrate or a leadframe may need to be aligned with an additional component (e.g. a lens, barrel, or interface) located on other pieces of the device (e.g. a lid piece).

An active optical device and a leadframe may be manufactured separate from a lid and a lens. However, alignment of the active optical device with the lens can be difficult where there are several stackable tolerances between the various processes required to manufacture the final optical device. For example, there can be molding processes, attaching processes, cutting processes, drilling processes, and etching processes that contribute to an overall tolerance for aligning an active optical device with a lens. In addition, where the different components, such as the active optical device and the lens, are located on different parts of the device that must be later assembled, such as the base and the lid, the assembly or attachment of the base with the lid must also be held within the stackable tolerances. Thus, what would be advantageous are methods and apparatuses for accurate placement of components of an optical assembly.

BRIEF SUMMARY OF THE INVENTION

An object of the present invention relates to accurately positioning components of an assembly using fiducial features. An optical device is described. The optical device can include a leadframe including a first fiducial feature, an electronic component coupled to the leadframe, wherein the first fiducial feature is used to position the active optical device when it is coupled to the leadframe, and an overmolded piece. The first fiducial feature can be used to position the leadframe relative to the overmolded piece when the overmolded piece is molded over the leadframe.

An assembly is described. The assembly can include a first piece including a first fiducial feature, a first component coupled to the first piece, and a second piece. The first component can be positioned relative to the second piece by positioning the first component relative to the first piece by visually referencing the first fiducial feature. The first piece can be positioned relative to the second piece by referencing the first fiducial feature.

A method for positioning components of an assembly is described. The method can include locating a first fiducial feature on a first piece of the assembly, positioning a first optical component on the first piece of the assembly by referencing the location of the first fiducial feature, and positioning the first piece relative to a second piece by referencing the location of the first fiducial feature.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Embodiments of the present invention relate to placement of components of an optical device. Principles of the present invention are described with reference to the attached drawings to illustrate the structure and operation of example embodiments used to implement the present invention. Using the diagrams and description in this manner to present the invention should not be construed as limiting its scope. Additional features and advantages of the invention will in part be obvious from the description, including the claims, or may be learned by the practice of the invention. Detailed descriptions of well-known components and processing techniques are omitted so as not to unnecessarily obscure the invention in detail.

Figure 1:
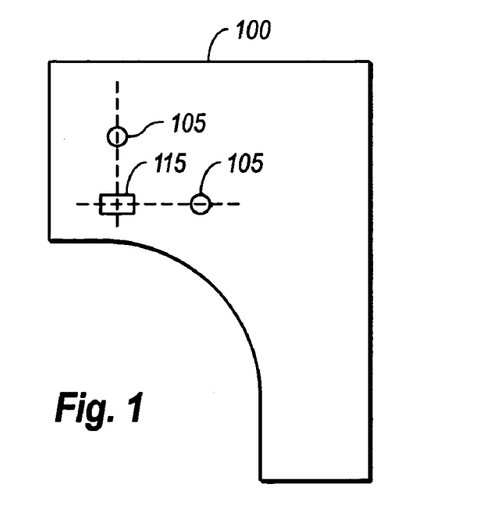
FIG. 1 illustrates a leadframe including two fiducial features for placement of an electronic device according to an example embodiment of the present invention.

Referring to FIG. 1, an illustration of a leadframe 100 including two fiducial features 105 that are referenced for placement of an electronic device 115 are shown according to an example embodiment of the present invention. The fiducial features 105 can be holes, protrusions, or other types of features. The fiducial features 105 may be formed, for example, by stamping, cutting, etching, or any other appropriate process. As shown, the fiducial features 105 can be circular features. Circular features can be particularly advantageous in visual systems for placement of the electronic device 115 with respect to the fiducial features 105. Circular features can be relatively easy for a visual system to recognize and use for determining positions from a center point of the circular feature. Additionally, circular features are particularly advantageous because while the outer size of the circular feature may change from part to part, the center point of the circular feature remains in a constant position from part to part.

The position of the fiducial features 105 relative to each other, and the position of the electrical device 115 can be embedded in CAD data used to program an assembly machine. A vision system can detect the fiducial features 105 and calculate the variation between their programmed position and a detected position. According to embodiments of the present invention, this can eliminate positional errors due to mechanical tolerances on the machine. Fiducial marks can also be used in conjunction with the fiducial features.

The electronic device 115 can be an optical transmitter, such as a light emitting diode or a laser (e.g. a vertical cavity surface emitting laser (VCSEL) or an edge emitting laser) for producing an optical emission. After the location of the electronic device 115 is determined by a vision system, the electronic device 115 can be attached to the leadframe 100. The electronic device 115 can be attached to the leadframe 100 using an attachment method such as die attach. The fiducial features 105 can be used to position the electronic device 115 upon the leadframe in two perpendicular axis.

Additional components and subcomponents can be positioned using the same fiducial features 105. Where the electronic device 115 is attached to a die that is attached to the leadframe 100 the fiducial features 105 can be used to position the electronic device 115 relative to the leadframe 100. The fiducial features 105 can be located local (i.e. near) to the electronic device 115 using the local fiducial features 105 for positioning. Fiducial features used for positioning can also be global fiducial features, or a combination of global and local fiducial features.

The leadframe 100 shown in FIG. 1 may then be at least partially overmolded by a molding process to create an optical component. In one example, the optical component may include overmolding at least a piece of the leadframe 100 with an, at least partially transparent or translucent plastic materials such that the electronic device 115 is able to transmit or receive optical signals through the plastic material. In one example, the overmolding may itself include a component, such as a lens or an interface. Using the fiducial features 105, the leadframe 100 can be properly positioned in a mold used for overmolding such that the electronic device 115 is aligned with the lens feature in the overmolded plastic. Thus, the fiducial features 105 can be referenced for positioning the electronic device relative to the leadframe 100 and the leadframe relative to the overmolding. A component, such as an interface or a lens, can be coupled to, or formed integral with, the overmolded piece. The interface or lens can be positioned by referencing a fiducial feature on the overmolded piece or the fiducial features 105.

Figure 2:
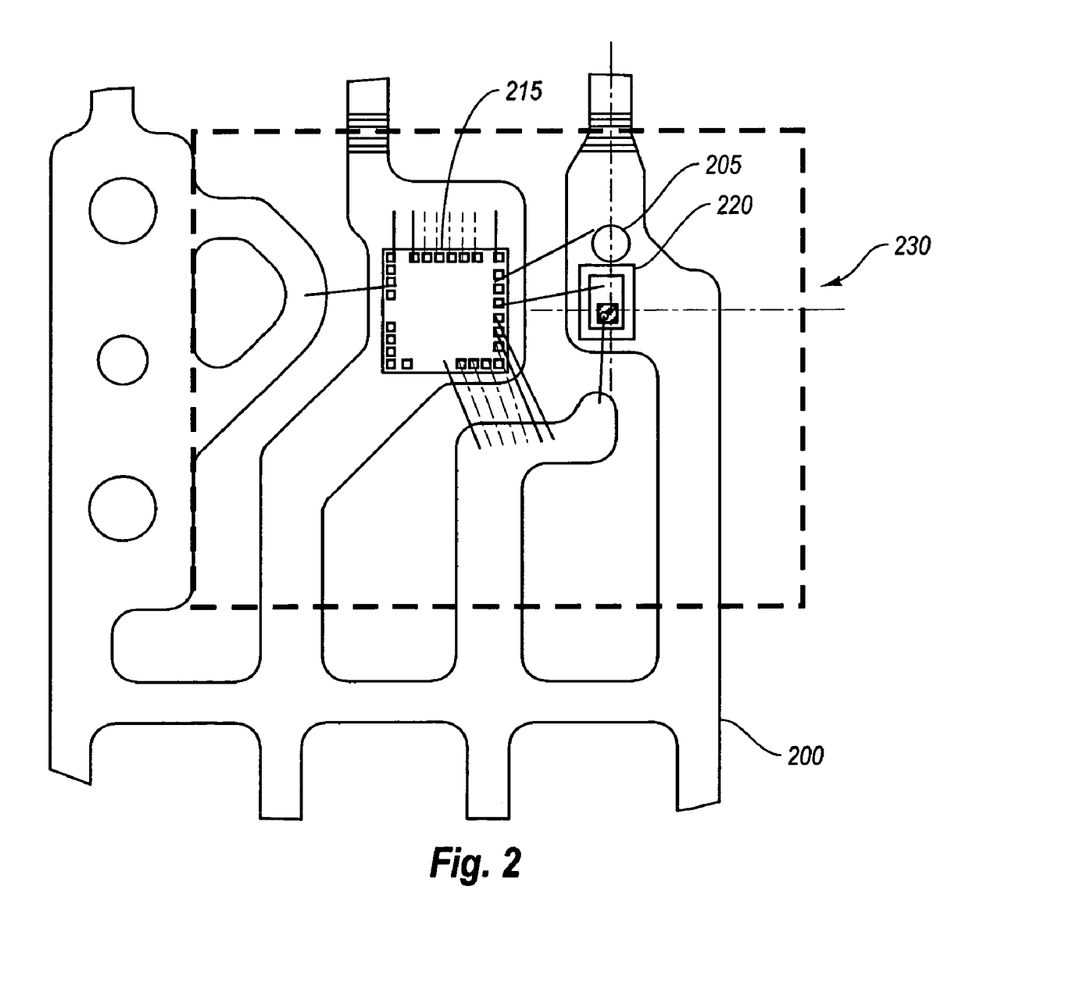
FIG. 2 is an illustration of a leadframe including a fiducial feature that can be referenced for placement of a first electronic device and/or a second electronic device according to an example embodiment of the present invention.

Referring to FIG. 2 an illustration of a leadframe 200 including a fiducial feature 205 that can be referenced for placement of a first electronic device 215 and/or a second electronic device 220 are shown according to an example embodiment of the present invention. The fiducial feature 205 can be a hole, protrusion, cavity, or other types of feature. The fiducial feature 205 may be formed, for example, by stamping, cutting, etching, or any other appropriate process. The fiducial feature 105 can be a circular feature as shown.

According to the embodiment illustrated in FIG. 2, the first electronic device 215 can be a circuit or chip, and the second electronic device 220 can be an optical transmitter, such as a VCSEL. After the location of the first electronic device 215 and the second electronic device 220 are determined by a vision system based on the position of the fiducial feature 205, the first electronic device 115 and the second electronic device 220 can be attached to the leadframe 200. Additional components, devices and subcomponents can also be positioned using the same fiducial feature 205.

The leadframe 200 shown in FIG. 1 may then be at least partially overmolded by a molding process (an overmolded piece 230 is indicated by a dotted line in FIG. 1). The fiducial feature 205 can be used to position the overmolding 230 when the leadframe 200 is overmolded. As a result, the fiducial feature 205 can be used to align the electronic devices 215 and 220 can be aligned with the overmolded piece 230. A component, such as an interface or lens, can be formed integral with the overmolded piece 230 and the interface or lens can be positioned relative to the leadframe 200, and as a result, relative to the second electronic component 220 by referencing the fiducial feature 205 when the leadframe 200 is overmolded.

Figure 3:
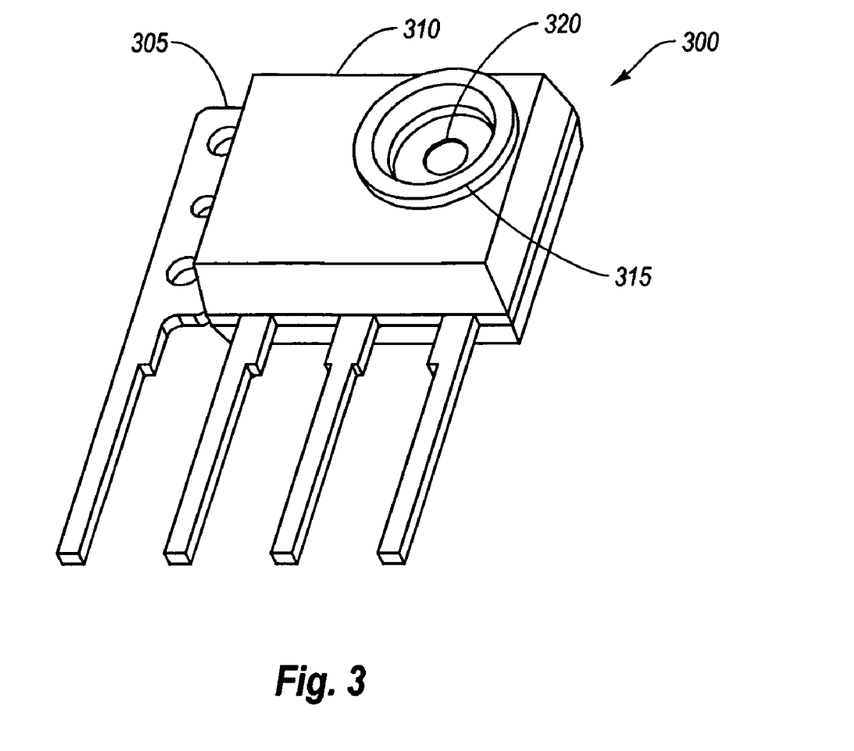
FIG. 3 is a perspective view illustrating a component having a leadframe overmolded by an overmolded piece.

Referring to FIG. 3, a perspective view is shown illustrating a component 300 having a leadframe 305 with components (not visible) overmolded by an overmolded piece 310. The overmolded piece 310 can include an interface 315 and a lens 320 that are aligned with an electronic component (not visible) located on a piece of the leadframe 305 when the overmolded piece 310 is overmolded over the leadframe 305. The interface 315 and/or the lens 320 can be formed integral with/or separate from the overmolded piece 310.

Figure 4:
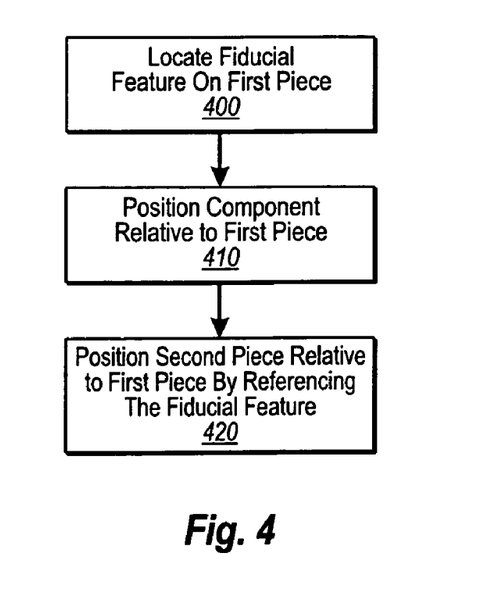
FIG. 4 illustrates a method for positioning a component and two pieces of an assembly according to an example embodiment of the present invention.

Referring to FIG. 4, a method for positioning a component and two pieces of an assembly is illustrated according to an example embodiment of the present invention. A fiducial feature can be located on a first piece of an assembly (400). The fiducial feature can be a fiducial hole, protrusion, cavity, shape, etc. The fiducial feature can be located by a visual system and the fiducial feature can be any shape (e.g. preferably a circle) recognizable by a vision system.

A component can be positioned on the first piece of the assembly (410). The component can be positioned using a CAD system or other visual-mechanical system for accurately positioning the component on the first piece. Manufacturing steps may be taken. For example, a hole or cavity may be manufactured in the first piece at the location where the component is positioned for it to be received or attached to the first piece. The component may also be attached to the first piece after it is positioned, for example using a glue, adhesive, die attach, weld, etc.

A second piece can be positioned relative to the first piece based on the location of the fiducial feature (420). The positioning can be accomplished using a visual-mechanical mechanism. The positioning can also be accomplished using properties of the fiducial feature itself to visually or mechanically position the first piece relative to the second piece. The positioning can be conducted prior to, simultaneous with, or subsequent to a manufacturing process. For example, where the first piece is a leadframe and the second piece is an overmolded piece, the positioning can be conducted prior to the second piece being produced by a molding process over the leadframe. The overmolded piece can also include a component, such as an interface or a lens, which can be at least partially produced simultaneously with the overmolded piece, for example using the same molding process. In this manner, the component of the second piece can be aligned with the component of the first piece when the overmolded piece is produced.

Figure 5:
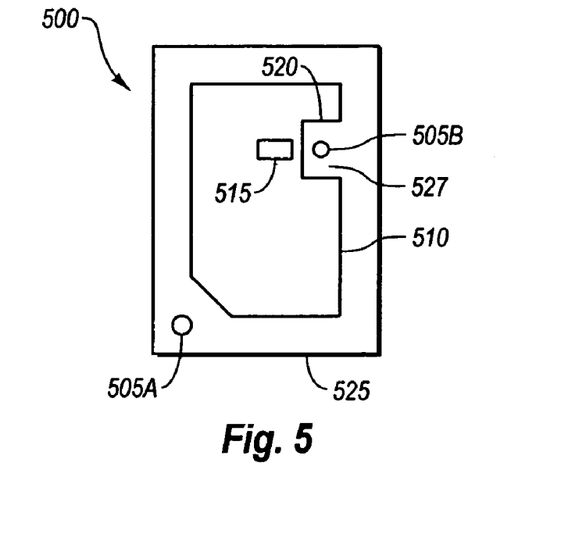
FIG. 5 illustrates an open cavity package including two fiducial features according to an example embodiment of the present invention.

Referring to FIG. 5, an open cavity package 500 including two fiducial features 505A and 505B is shown according to an example embodiment of the present invention. The open cavity package 500 can comprise a leadframe 510 or other support structure for supporting an electronic component such as an active optical device 215, for example. The active optical device 515 can be an optical transmitter, such as a laser or a light emitting diode, or an optical receiver, such as a photodiode or a phototransistor. The open cavity package 500 can include the fiducial features 505A and 505B for positioning the active optical device 515. The fiducial features 505A and 505B can be located on any piece of the open cavity package 500. For example, one fiducial feature 505A can be located in an outer piece 525 (e.g. an overmolded piece) of the open cavity package 500 and a second fiducial feature 505B can be located in an inner piece 527 of the open cavity package 500 near the active optical device 515. In one example, the open cavity package 500 can be molded around the leadframe 510. Molding may include forming the fiducial feature 505B in the open cavity package 500 such that metal from the leadframe 510 is exposed. This creates a contrasting feature that may be used by the vision system to appropriately position the active optical device 515 with respect to the fiducial feature 505B. Alternatively, when the fiducial feature 505B is located in a piece of the open cavity package that would ordinarily be beneath the leadframe 519, a piece 520 of the leadframe 510 can be removed, for example using an etching process to expose the inner piece 527 of the package for placement of the fiducial feature 505B.

The outer piece 525 of the open cavity package 500 can be made from a plastic, for example using a transfer or injection molding process, and the leadframe can be embedded in, attached to, or supported by the outer piece 525 of the open cavity package 500. The fiducial features 505A and 505B can be used for the purpose of positioning the active optical device 515 relative to the leadframe 510 and/or for positioning the leadframe 510 relative to the outer plastic piece 525 of the package 500.

Figure 6A:
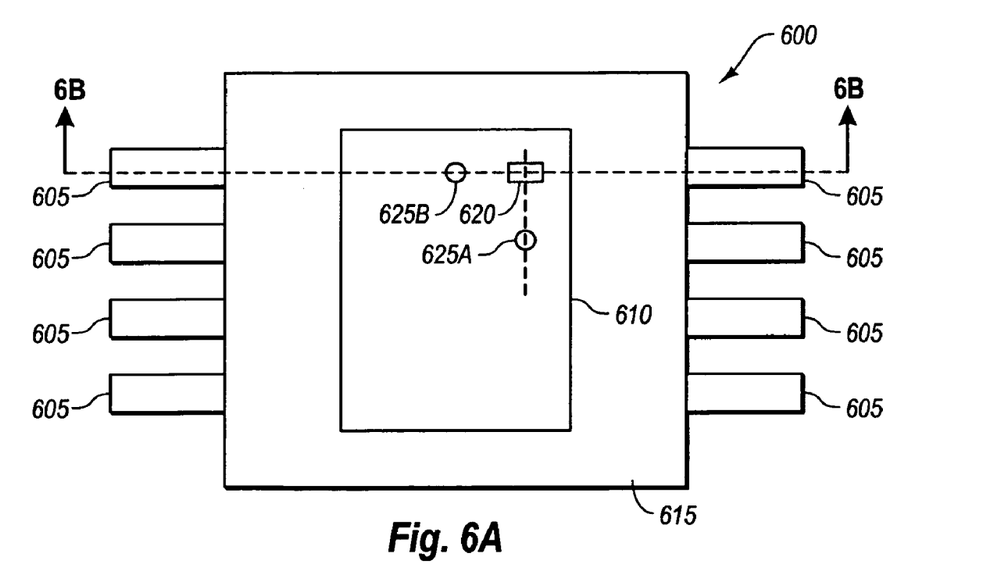
FIGS. 6A and 6B illustrate an embodiment of an open cavity package according to an example embodiment of the present invention.
Figure 6B:
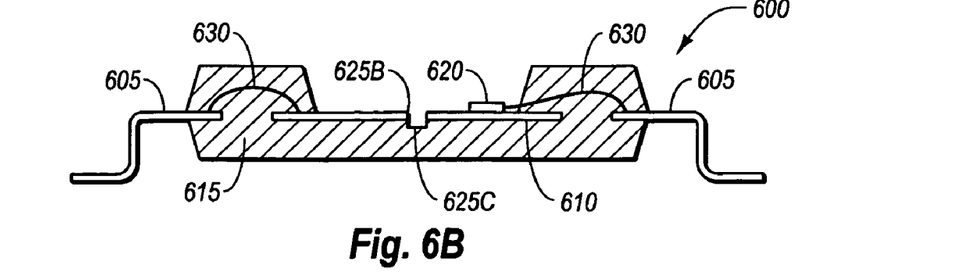

Referring now to FIGS. 6A and 6B, an embodiment of an open cavity package 600 is shown according to an example embodiment of the present invention. FIG. 6A is a top perspective view of the open cavity package 600. The open cavity package 600 can include several contacts 605 for providing electrical connection to any component of the open cavity package 600. The open cavity package 600 can include a leadframe 610 embedded in a transfer or injection molded plastic piece 615 (e.g. an overmolded piece). An active optical device 620 can be attached to the leadframe 610, for example using a die attach process. The leadframe 610 can include two fiducial features 625A and 625B, such as holes in the leadframe as shown in FIG. 6A. The fiducial features 625A and 625B can be used to position the active optical device 620 relative to the leadframe 610 during the die attach process.

Referring now to FIG. 6B, the open cavity package 600 is shown from a cross sectional view. As shown, the open cavity package 600 can include the embedded leadframe 610 along with several contacts 605 for providing electrical connection to the active optical device 620. The electrical contacts 605 can be electrically coupled to the leadframe 610 and/or the active optical device 620 using leads 630. One of the fiducial features 625B is shown extending through the leadframe 610. An additional fiducial feature 625C, in this case a round cavity, can be located in the transfer molded piece 615 of the open cavity package 600 below, but aligned with, the fiducial feature 625B. This fiducial feature 625C can be used along with, or independent from, the fiducial feature 625B in the leadframe 610 to position the leadframe 610 relative to the plastic piece 615 of the open cavity package 600.

Figure 7:
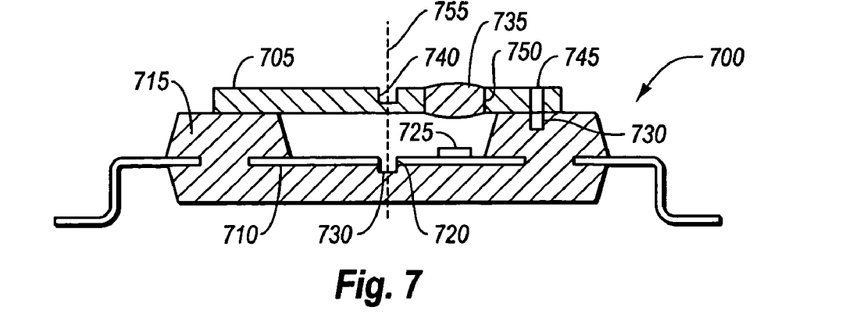
FIG. 7 illustrates an open cavity package having a lid according to an example embodiment of the present invention.

Referring now to FIG. 7, an open cavity package 700 having a lid piece 705 is shown according to an example embodiment of the present invention. The open cavity package 700 can have a leadframe 710 embedded in a plastic piece 715 (e.g. an overmolded piece). The leadframe 710 can have a fiducial feature 720, such as a hole, for positioning an active optical device 725 relative to the leadframe 710 and for positioning the leadframe 710 relative to the plastic piece 715 of the open cavity package 700. The plastic piece 715 can also have a fiducial feature 730, such as a hole or cavity, for positioning the leadframe 710 relative to the plastic piece 715 of the open cavity package 700. The lid 705 can also be positioned on the top of the open cavity package 700. The lid 705 can serve any purpose, such as protection of the components of the open cavity package 700. The lid 705 can also include additional components, such as a lens 735 for focusing or collimating an optical emission to or from the active optical device 725.

According to example embodiments of the present invention, fiducial features can be used to position components located on one piece of a device, in this case the lid piece 705 and plastic base piece 715 of the device 700, relative to other components located on other pieces of an assembly. For example, the lid 705 can include a hole fiducial feature 740 as well as a cavity fiducial feature 745. The lens 735 can be positioned relative to the lid 705 using the hole fiducial feature 745 of the lid 705 and/or the cavity fiducial feature 740 of the lid. For example, a visual system can locate the position of the hole fiducial feature 745 and/or the cavity fiducial feature 740 and manufacture a hole 750 in the lid 705 for receiving the lens 735 taking into consideration any variation in the location of the hole fiducial feature 750 and/or the cavity fiducial feature 740 to determine the appropriate position of the hole 750 for receiving the lens 735. The hole fiducial feature 745 can also be used along with a cavity fiducial feature 730 located in the outer piece of the plastic base piece 715 of the open cavity package 700 to position the lid 705 relative to the plastic base piece 715, and as a result position the lens 735 relative to the active optical device 725. The location of the fiducial feature 720 in the leadframe 710 can be identified by a visual system and the cavity fiducial feature 740 in the lid can also be located and used to position the lid 705 relative to the plastic base piece 715. A peg or other mechanical referencing device can be inserted into the fiducial features 745 and 730 to mechanically position the lid 705 relative to the plastic base piece 715. In addition, where the lid 705 is made of an at least partially transparent material, the cavity fiducial feature 740 of the lid can be positioned relative to the fiducial feature 720 of the leadframe 710 simultaneously as indicated by dotted line 755.

Thus, the active optical device 725 can be positioned relative to the leadframe 710 using the fiducial feature 720 in the leadframe 710. The leadframe 710 can be positioned relative to the plastic base piece 715 of the open cavity package 700 using the fiducial feature 720 in the leadframe 710 and using the fiducial feature 730 in the plastic base piece 715 of the open cavity package 700. The lens 750 can be positioned relative to the lid 705 using the fiducial features 740 and 745 in the lid, and the lid 705 can be positioned relative to the base piece 715 using fiducial features 740, 745, 730, and/or 720 when the lid 705 is attached to, or assembled with, the base piece 715. As a result, the lens 735 attached to the lid 705 can be more accurately and precisely positioned and aligned with the active optical device 725 attached to the leadframe 710.

Figure 8A:
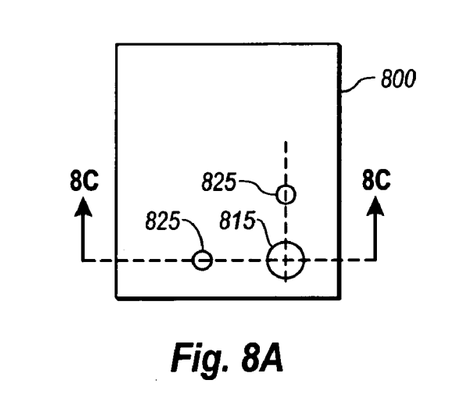
FIGS. 8A-C illustrate a first piece of an assembly and a second piece of the assembly according to an example embodiment of the present invention.
Figure 8B:
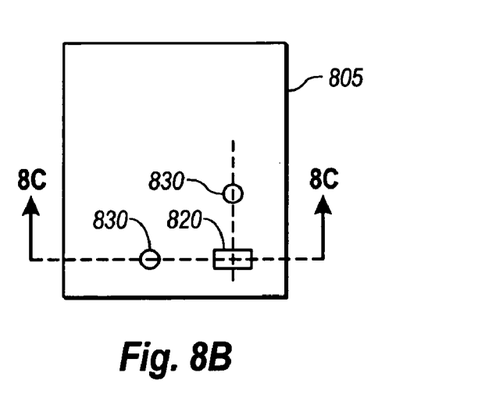
Figure 8C:
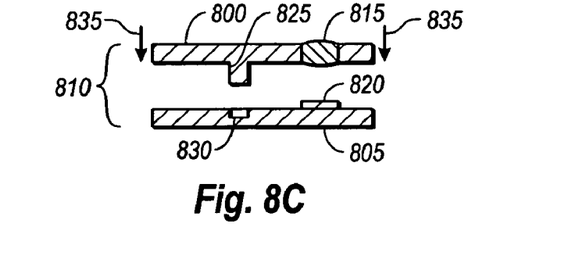

Referring now to FIGS. 8A-C, a first piece 800 and a second piece 805 of an assembly 810 (e.g. an assembled device) are shown according to an example embodiment of the present invention. A first component 815 can be positioned relative to the first piece 800 using a visual system to reference two fiducial features 825. A second component 820 of the second piece 805 can be positioned relative to the second piece 805 using a visual system to reference two fiducial features 830 of the second piece 805.

Referring specifically to FIG. 8C, a cross sectional view of the first piece 800 and the second piece 805 of the assembly 810 is shown according to an example embodiment of the present invention along with arrows 835 indicating a direction in which the first piece 800 and the second piece 805 can be assembled. As illustrated, the fiducial feature 825 of the first piece 800 can be a protrusion having a substantially circular cross sectional shape. The fiducial feature 830 of the second piece 805 can be a cavity with a substantially circular cross-sectional shape that is shaped and configured to closely receive the fiducial feature 825 of the first piece 800 of the assembly 810. Thus, in addition to positioning the components 815 and 820 of each piece 800 and 805 of the assembly 810 relative to that particular piece 800 and 805 of the assembly 815 using a visual positioning system, the fiducial features 825 and 830 can also act as mechanical positioning features to position the two pieces 800 and 805 of the assembly 810 relative to each other when the first piece 800 and second piece 805 are assembled together. As a result, the first component 815 of the first piece 800 can be aligned with the second component 820 of the second piece 805 in a precise and accurate manner.

Figure 9:
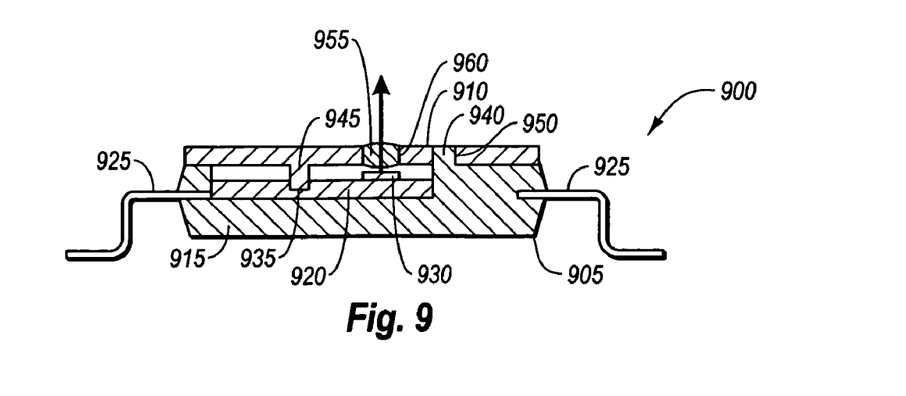
FIG. 9 illustrates an open cavity package and lid assembly according to an example embodiment of the present invention.

Referring to FIG. 9, an open cavity package 905 and a lid 910 assembly 900 is shown according to an example embodiment of the present invention. The open cavity package 905 can include a plastic piece 915 (e.g. an overmolded piece) with an embedded leadframe 920. The plastic piece 915 can be manufactured using a molding process as is known to one of skill, such as a transfer molding process. The open cavity package 905 can further include contacts 925 for providing electrical connection to the leadframe 920 and a first component 930 of the open cavity package 905. The leadframe 920 can include a fiducial feature, such as a fiducial cavity 935. The fiducial cavity 935 can have a substantially circular cross sectional shape. The first component 930, such as an active optical device, can be positioned upon the leadframe 920 by referencing the fiducial cavity 935. The leadframe 920 can include any number of fiducial cavities. For example, a first fiducial protrusion 940 can be located in the plastic piece 915 of the open cavity package 905. Additional fiducial cavities, protrusions, or other fiducial features can also be included in the design of the open cavity package 905, which may not be visible from the illustration of FIG. 9. The fiducial protrusion 940 of the open cavity package 905 can be used to position any of the components of the open cavity package 905 relative to other components of the open cavity package 905. For example, the fiducial protrusion 940 of the open cavity package 905 can be used along with a visual system to position the leadframe 920 relative to the plastic piece 915 of the open cavity package 905. The fiducial protrusion 940 can also be used to position the first component 930 of the open cavity package 905 relative to the leadframe 920 or the plastic piece 915 of the open cavity package 905.

The assembly 900 illustrated in FIG. 9 can further include the lid piece 910. The lid piece 910 can include a fiducial protrusion 945 and/or a fiducial hole 950. The fiducial protrusion 945 and/or the fiducial hole 950 can be used to position a lens 955 relative to the lid piece 910. For example, the fiducial protrusion 945 and/or the fiducial hole 950 can be used in conjunction with a visual system to calculate positional variations in the lid piece 910 and to position and manufacture a hole 960, for example using a drilling or boring process, in the lid piece 910 and attach the lens 955, or other component, to the lid piece 910. The fiducial cavity 935 of the open cavity package 905 can be sized and configured to closely receive the fiducial protrusion 945 of the lid piece 910 thereby mechanically positioning the lid piece 910 relative to the open cavity piece 905 of the assembly 900 when assembled and optically aligning the active optical device 930 with the lens 955. Similarly, the fiducial hole 950 of the lid piece 910 can be sized and configured to closely receive the fiducial protrusion 940 of the open cavity package 905 thereby mechanically positioning the lid piece 910 relative to the open cavity piece 905 of the assembly 900 and optically aligning the active optical device 930 with the lens 955 when assembled.

Embodiments of the present invention include methods and apparatuses including fiducial features for positioning components and subcomponents of an assembly relative to each other. Aspects of the present invention can be particularly advantageous where there is a need to maintain alignment of components of different pieces of an assembly. While several of the above described embodiments include open cavity packages other embodiments of the present invention include other types of packages, such as plastic lead frame packages, PBGA packages, hermetic packages, and custom packages, implementing fiducial features to position different components of the packages relative to each other. For example, aspects of the present invention can be used to position components of TO-can packages, sensor packages, optical transmission packages, optical receiving packages, as well as other packages.

Figure 10A:
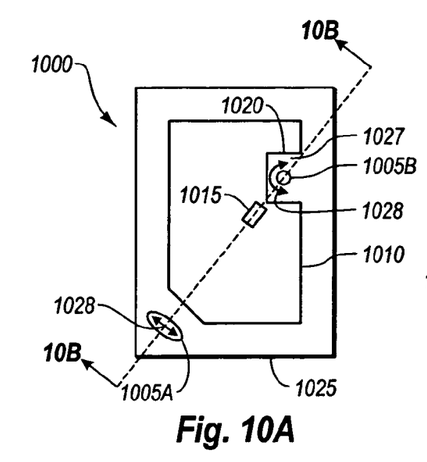
FIGS. 10A and 10B illustrate an open cavity package and a corresponding lid piece according to an example embodiment of the present invention.

Referring to FIG. 10A, an open cavity package 1000 including two fiducial features 1005A and 1005B is shown according to an example embodiment of the present invention. The open cavity package 1000 can comprise a leadframe 1010 or other support structure for supporting an electronic component such as an active optical device 1015. The active optical device 1015 can be an optical transmitter, such as a laser, a light emitting diode, or an optical receiver, such as a photodiode or phototransistor. The open cavity package 1000 can include the fiducial features 1005A and 1005B for positioning the active optical device 1015. The fiducial features 1005A and 1005B can be located on any piece of the open cavity package 1000. For example, one fiducial feature 1005A can be located in an outer piece 1025 of the open cavity package 1000 and a second fiducial feature 1005B can be located in an inner piece 1027 of the open cavity package 1000 near the active optical device 1015. The outer piece 1025 may extend over the leadframe 1010 and the fiducial feature 1005B may be formed in the outer piece 1025 so as to create a contrasting feature including the metal pieces of the leadframe 1010. Alternatively, a piece 1020 of the leadframe 1010 can be removed, for example using an etching process to expose the inner piece 1027 of the package for placement of the fiducial feature 1005B.

The outer piece 1025 of the open cavity-package 1000 can be made from a plastic, for example using a transfer or injection molding process, and the leadframe 1010 can be embedded in, attached to, or supported by the outer piece 1025 of the open cavity package 1000. The fiducial features 1005A and 1005B can be used for the purpose of positioning the active optical device 1015 relative to the leadframe 1010 and/or for positioning the leadframe 1010 relative to the outer plastic piece 1025 of the package 1000. For example, the etched piece 1020 can also be a fiducial feature on the leadframe 1010 and can be used to position the active optical device 1015 relative to the leadframe 1010. The etched piece 1020 can also be used to position the leadframe 1010 relative to the outer piece 1025 of the package 1000. Thus, the outline of the removed piece 1020 of the leadframe 1010 can also be used as a fiducial feature with enough contrast to be located by a vision system and position components of the open cavity package 1000.

As illustrated in FIG. 10A, one of the fiducial features 1005A can be an elongated slot allowing for a corresponding substantially circular fiducial feature to be received within the elongated slot fiducial feature 1005A. The other fiducial feature 1005B can be a circular fiducial feature for closely receiving a corresponding fiducial feature having the shape of a substantially circular protrusion and allowing for the corresponding fiducial feature to pivot within the circular fiducial feature 1005B. As a result, two fiducial features of a lid piece can be received by the fiducial features 1005A and 1005B and a lens, or other component, located on a lid piece can be pivoted within the fiducial feature 1005B and moved within fiducial feature 1005A as indicated by arrows 1028. By pivoting a lid piece placed upon the open cavity package 1000, a lens can be adjusted in relation to the active optical device 1015. In this manner a certain amount of adjustability of the position of a component, such as a lens, in relation to the active optical device 1015 can be provided for to allow the lens to be optically aligned with the active optical device 1015.

Figure 10B:
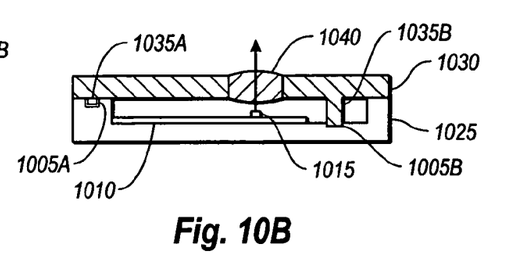

Referring now to FIG. 10B the open cavity package of FIG. 10A is illustrated along with a corresponding lid piece 1030. The lid piece 1030 can include a first fiducial feature 1035A received by the fiducial feature 1005A of the open cavity package 1000. The lid piece 1030 can further include a second fiducial feature 1035B received by the fiducial feature 1005B of the open cavity package. The lid piece 1030 can include a lens 1040 that is positioned relative to the lid 1030 using the fiducial features 1035A and 1035B. The lid piece 1030 can be mechanically positioned upon the open cavity package 1000 by engaging the fiducial features 1035A and 1035B with the fiducial features 1005A and 1005B respectively of the open cavity package 1000. The fiducial feature 1005A can have a slot configuration as illustrated in FIG. 10A and allow for the fiducial feature 1035A to move within the fiducial feature 1005A causing the fiducial feature 1035B to pivot within fiducial feature 1005B. As a result, a level of adjustability of lens 1040 in relation to active optical device 1015 is provided for as indicated by arrows 1028 in FIG. 10A.

Figure 11:
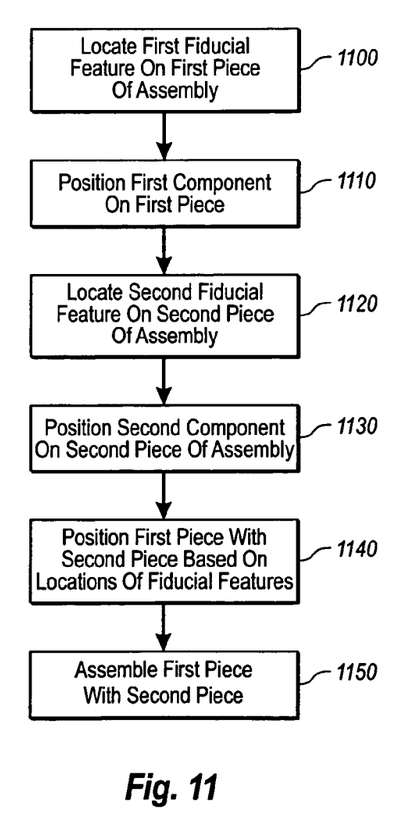
FIG. 11 illustrates a method for aligning components of an assembly according to an example embodiment of the present invention.

Referring to FIG. 11, a method for aligning components of an assembly is illustrated according to an example embodiment of the present invention. A first fiducial feature can be located on a first piece of an assembly (1100). The first fiducial, feature can be a fiducial hole, protrusion, cavity, shape, etc. The first fiducial feature can be located by a visual system and the first fiducial feature can be any shape recognizable by a vision system.

A first component can be positioned on the first piece of the assembly (1110). The first component can be positioned using a CAD system or other visual-mechanical system for accurately positioning the component on the first piece. Manufacturing steps may be taken. For example, a hole or cavity may be manufactured in the first piece at the location where the first component is positioned for it to be received or attached to the first piece. The first component may be attached to the first piece after it is positioned, for example using a glue, adhesive, die attach, weld, etc.

A second fiducial feature on a second piece of the assembly can be located (1120). The second fiducial feature can be a fiducial hole, protrusion, cavity, shape, etc. The second fiducial feature can be configured to correspond to the first fiducial feature of the first piece. For example, the second fiducial feature can include properties that allow it to be mechanically and/or visually positioned relative to the first fiducial feature of the first piece.

The second component can be positioned relative to the second piece of the assembly (1130). The second component can be positioned relative to the second piece of the assembly based on the location of the second fiducial feature. A mechanical positioning mechanism can be used to position the second component relative to the second piece of the assembly in an accurate and precise manner. The second component can also be attached to the second piece using an attaching means, such as glue, adhesive, mechanical features, press-fit engagement, or die attach for example.

The first piece can be positioned relative to the second piece based on the locations of the fiducial features (1140). The positioning can be accomplished using a visual-mechanical mechanism. The positioning can also be accomplished using properties of the fiducial features themselves to visually or mechanically position the first piece relative to the second piece. For example, the first fiducial feature can be a fiducial protrusion, hole, cavity, or other feature that is shaped or configured to mechanically engage, or visually align with, the second fiducial feature to position the first piece relative to the second piece.

The first piece can be assembled with the second piece (1150). In this manner, the first component can be positioned relative to the second component using the first and second fiducial features. The first piece can be attached to the second piece using any attaching means. Attaching means can include glue, adhesive, press fit engagements, mechanical features, or the like. In some instances, the fiducial features can be used to reduce the risk of loosing the stackable tolerances inherent in using multiple manufacturing processes to assemble components and subcomponents of an assembly where relative positioning of the components and subcomponents is desirable. For example, relative positioning of components and subcomponents of an assembly can be desirable in optical systems for transfer of optical signals between various devices.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for positioning components of an optical assembly comprising the following acts:
   locating a first fiducial feature on a first piece of the assembly;
   positioning a first optical component on the first piece of the assembly by referencing the location of the first fiducial feature; and
   positioning the first piece relative to a second piece by referencing the location of the first fiducial feature, wherein the first piece includes a leadframe and the second piece includes an overmolded piece.

2. A method according to claim 1, further comprising the following acts:
   locating a second fiducial feature on the second piece of the assembly; and
   positioning a second optical component relative to the second piece of the assembly by referencing the location of the second fiducial feature, wherein the first piece is positioned relative to the second piece by referencing the location of both the first and second fiducial features.

3. A method according to claim 2, wherein each fiducial feature is visually located, each component is mechanically positioned, and the first piece is mechanically positioned relative to the second piece using a physical property of the first and second fiducial features.

4. The method of claim 2, further comprising the following acts:
   mechanically coupling the first component to the first piece;
   mechanically coupling the second component to the second piece; and
   optically coupling the first component to the second component.

5. The method of claim 2, further comprising the following acts:
   mechanically coupling the first component to the first piece;
   mechanically coupling the second component to the second piece; and
   mechanically coupling the first piece to the second piece.

6. The method of claim 2, wherein the first piece is an optical package, the second piece is a lid, the first component is an active optical device, and the second component is a lens.

7. The method of claim 2, wherein the fiducial features are one of a protrusion, a hole, or a cavity.

8. The method of claim 6, wherein the active optical device is one of a vertical cavity surface emitting laser, an edge emitting laser, and a photodiode.

* * * * *

UNITED STATES PATENT AND TRADEMARK OFFICE
CERTIFICATE OF CORRECTION

PATENT NO. : 7,371,652 B2
APPLICATION NO. : 11/158682
DATED : May 13, 2008
INVENTOR(S) : Aizpuru et al.

It is certified that error appears in the above-identified patent and that said Letters Patent is hereby corrected as shown below:

Col. 4
Line 16 change "materials" to --material--
Line 36 change "types" to --type--
Line 47 change "115" to --215--
Line 52 change "Fig. 1" to --Fig. 2--
Line 54 change "Fig. 1)" to --Fig. 2)--
Line 58 change "can be aligned with" to --with--

Col. 6
Line 2 change "519" to --510--

Col. 7
Line 4 change "740" to --745--
Line 5 change "745" to --740--
Line 38 change "750" to --735--

Col. 11
Line 19 change "loosing" to --losing--

Signed and Sealed this

Twenty-third Day of November, 2010

David J. Kappos
*Director of the United States Patent and Trademark Office*